United States Patent
Heubes

(10) Patent No.: US 6,667,617 B2
(45) Date of Patent: Dec. 23, 2003

(54) MULTI-ECHO MAGNETIC RESONANCE IMAGING METHOD WITH REDUCTION OF ARTIFACTS CAUSED BY REMANENCE MAGNETIZATION

(75) Inventor: Peter Heubes, Poxdorf (DE)

(73) Assignee: Siemens Aktiengesellschaft, München (DE)

( * ) Notice: Subject to any disclaimer, the term of this patent is extended or adjusted under 35 U.S.C. 154(b) by 18 days.

(21) Appl. No.: 10/022,684

(22) Filed: Dec. 17, 2001

(65) Prior Publication Data

US 2002/0135366 A1 Sep. 26, 2002

(30) Foreign Application Priority Data

Dec. 20, 2000 (DE) .......................... 100 63 676

(51) Int. Cl.[7] ................................. G01V 3/00
(52) U.S. Cl. ....................... 324/307; 324/309
(58) Field of Search ................. 324/307, 309

(56) References Cited

U.S. PATENT DOCUMENTS

| | | | | |
|---|---|---|---|---|
| 5,280,244 A | * | 1/1994 | Hinks | 324/306 |
| 5,578,924 A | * | 11/1996 | Dumoulin et al. | 324/309 |
| 5,671,742 A | * | 9/1997 | Dumoulin et al. | 324/318 |
| 5,729,139 A | | 3/1998 | Goto | |
| 6,011,392 A | | 1/2000 | Zhou et al. | |
| 6,043,656 A | | 3/2000 | Ma et al. | |
| 6,181,134 B1 | * | 1/2001 | Wald | 324/307 |
| 6,369,568 B1 | * | 4/2002 | Ma et al. | 324/309 |
| 6,424,152 B1 | * | 7/2002 | Prins et al. | 324/307 |

FOREIGN PATENT DOCUMENTS

| | | |
|---|---|---|
| EP | 1 058 123 | 6/2000 |
| EP | 0 752 596 | 8/2000 |

* cited by examiner

Primary Examiner—Diego Gutierrez
Assistant Examiner—Dixomara Vargas
(74) Attorney, Agent, or Firm—Schiff Hardin & Waite

(57) ABSTRACT

In a multi-echo magnetic resonance imaging method a number of high-frequency pulses are generated involving a high-frequency excitation pulse and a number of following high-frequency refocusing pulses, at least two phase encoding gradient pulses are respectively generated between the high-frequency refocusing pulses, and at least two compensation phase encoding gradient pulses are generated between the high-frequency excitation pulse and the first high-frequency refocusing pulse.

10 Claims, 7 Drawing Sheets

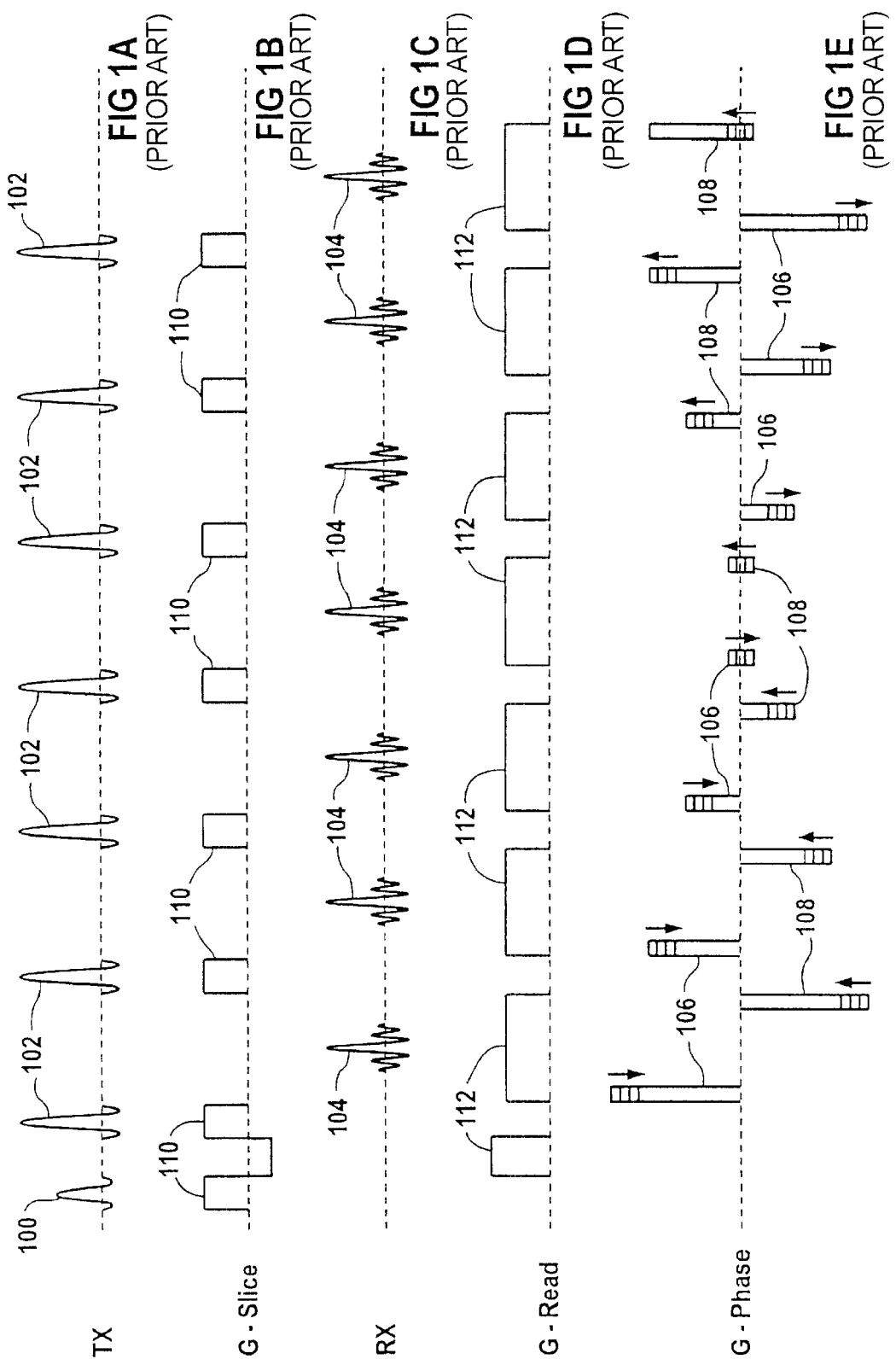

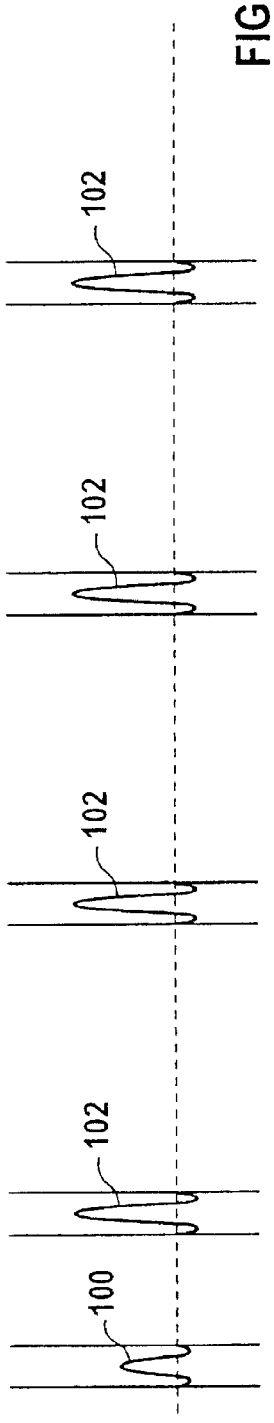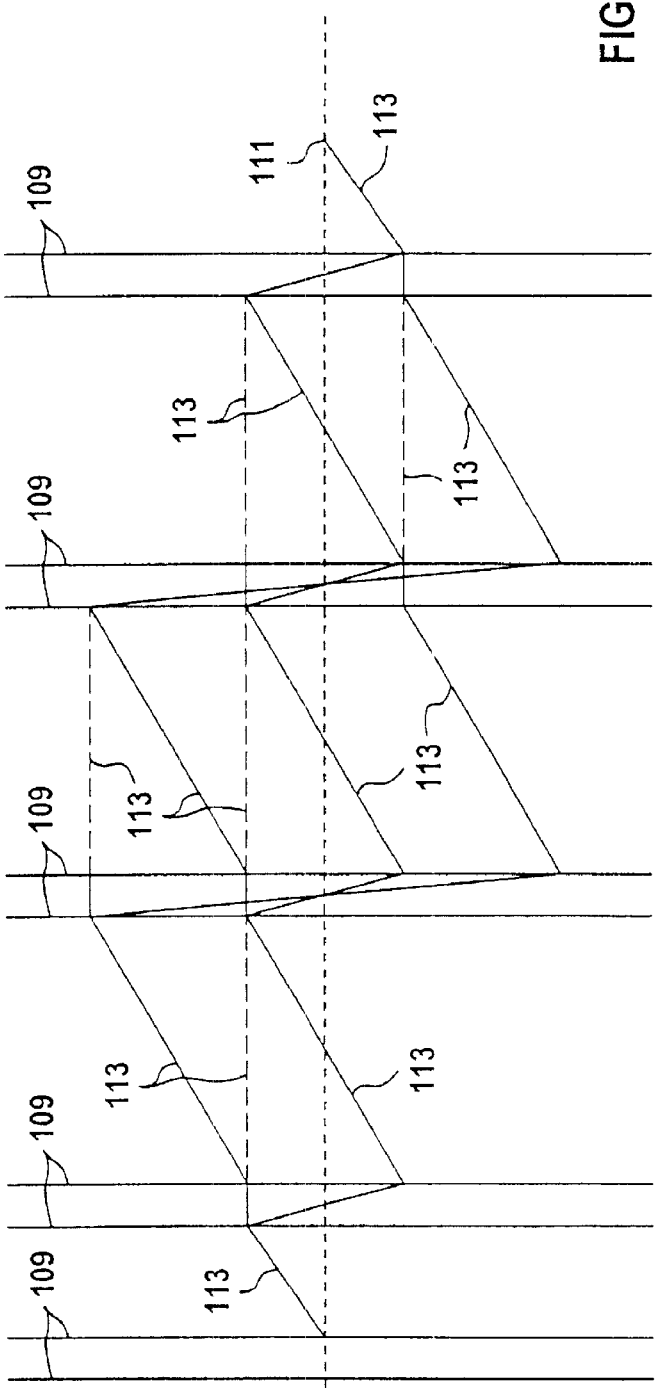

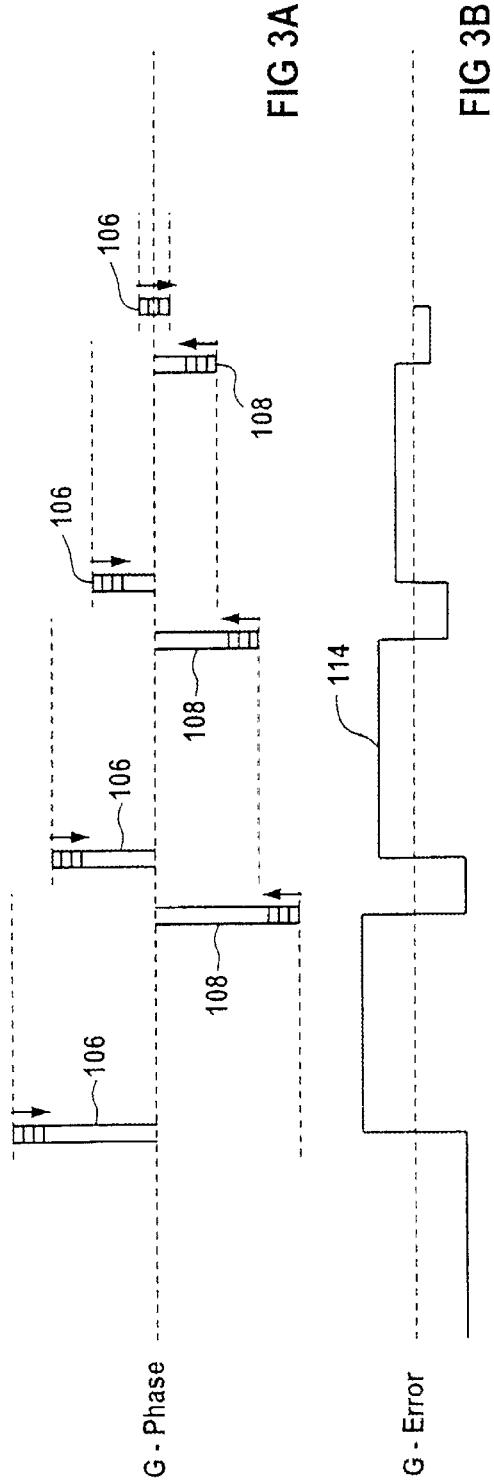
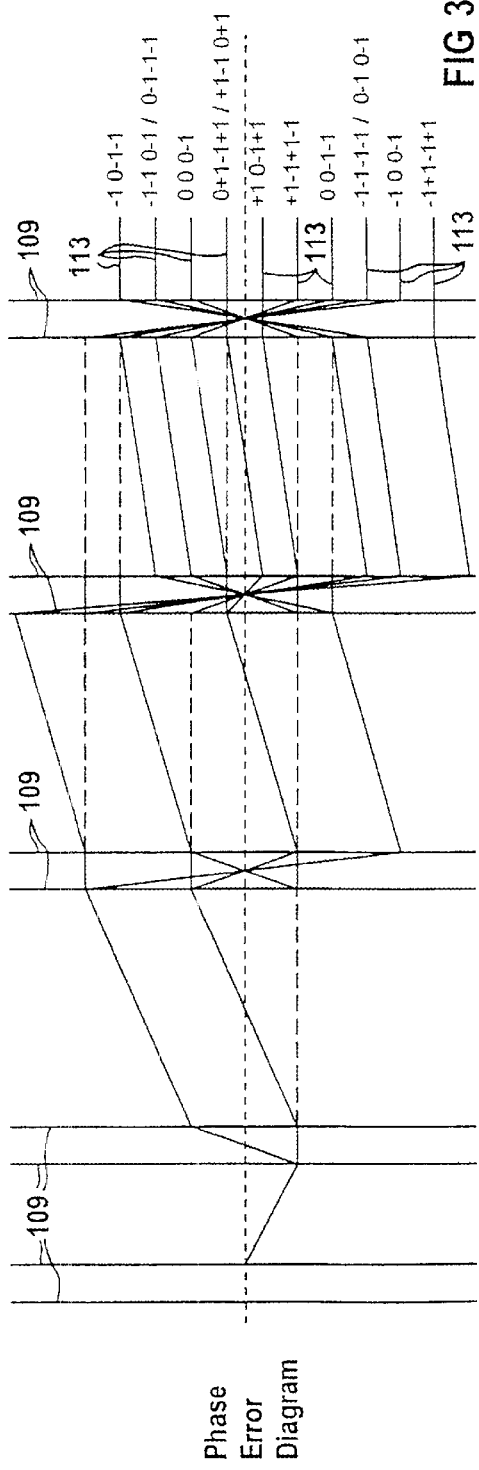

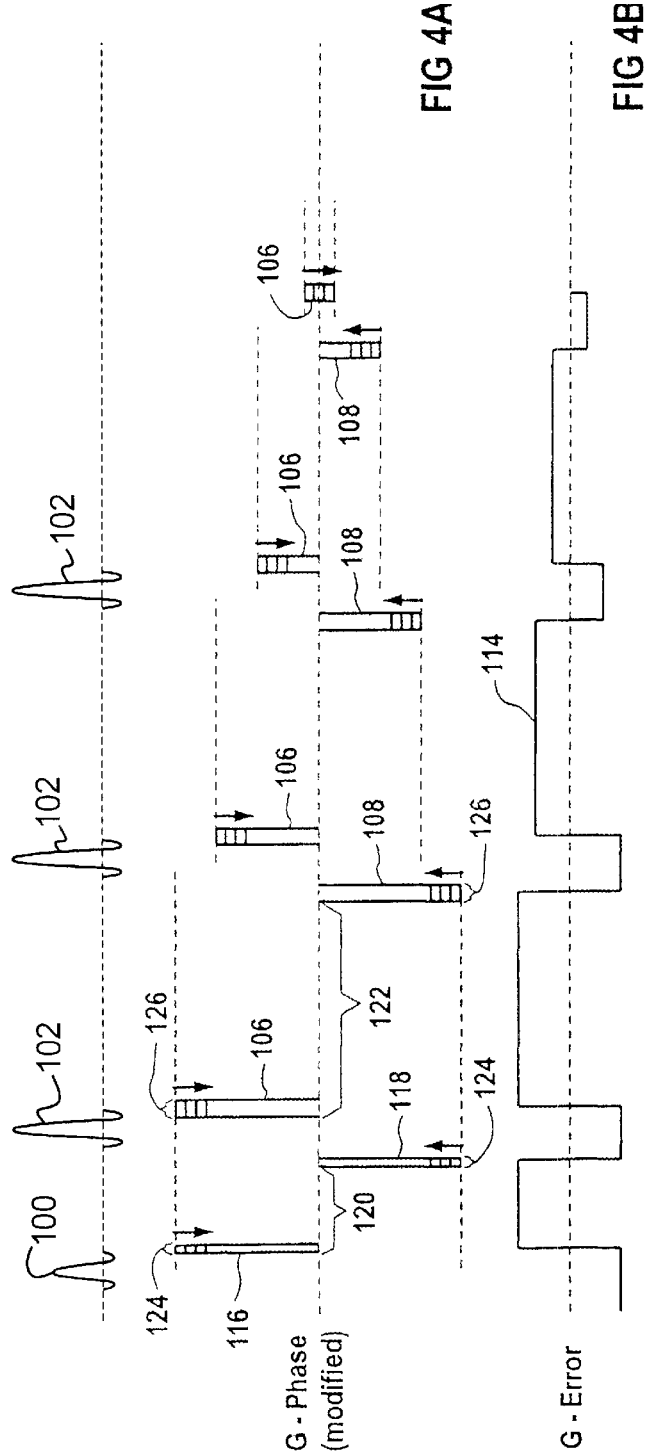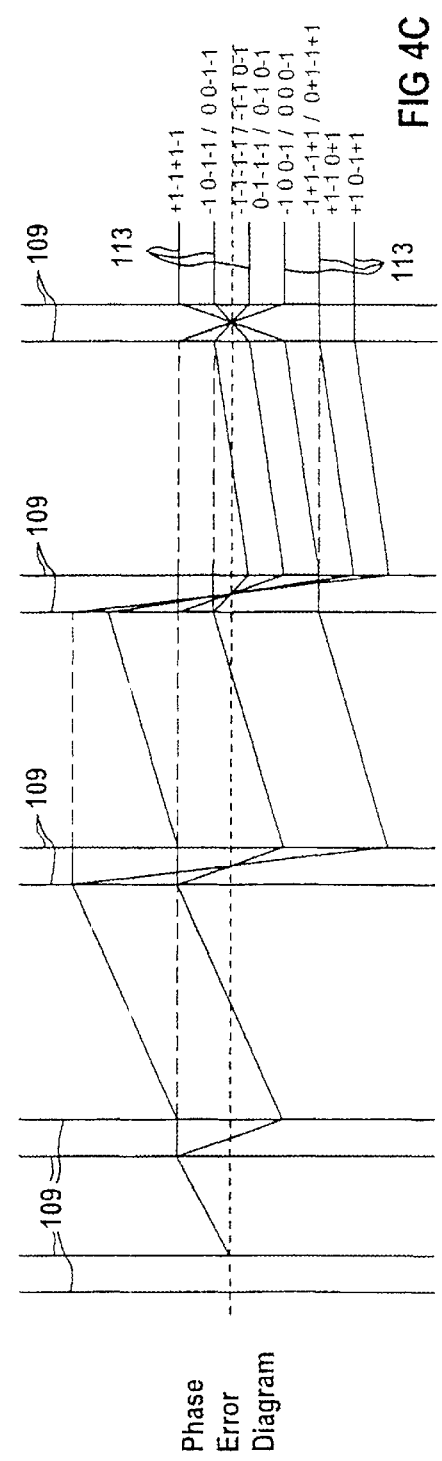

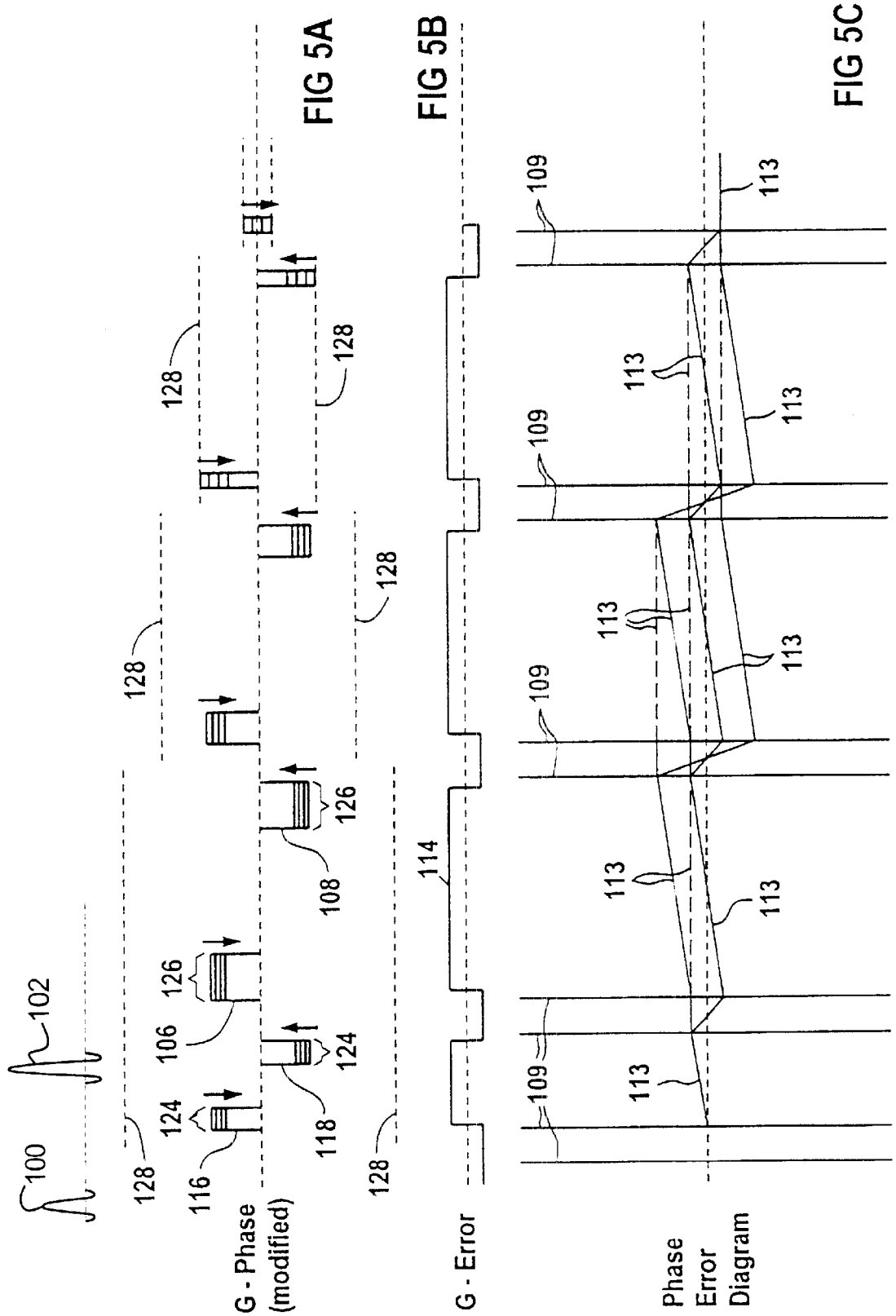

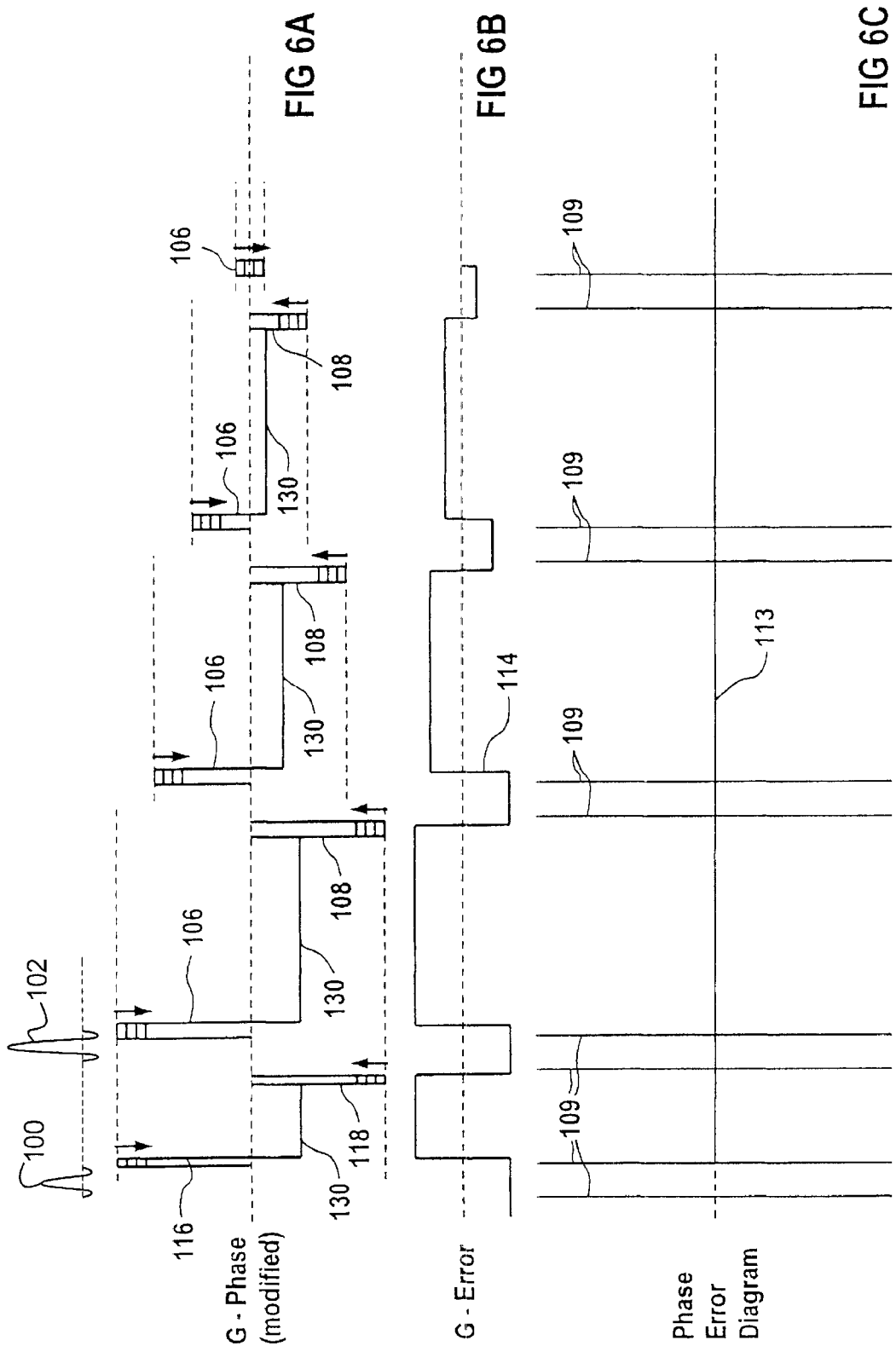

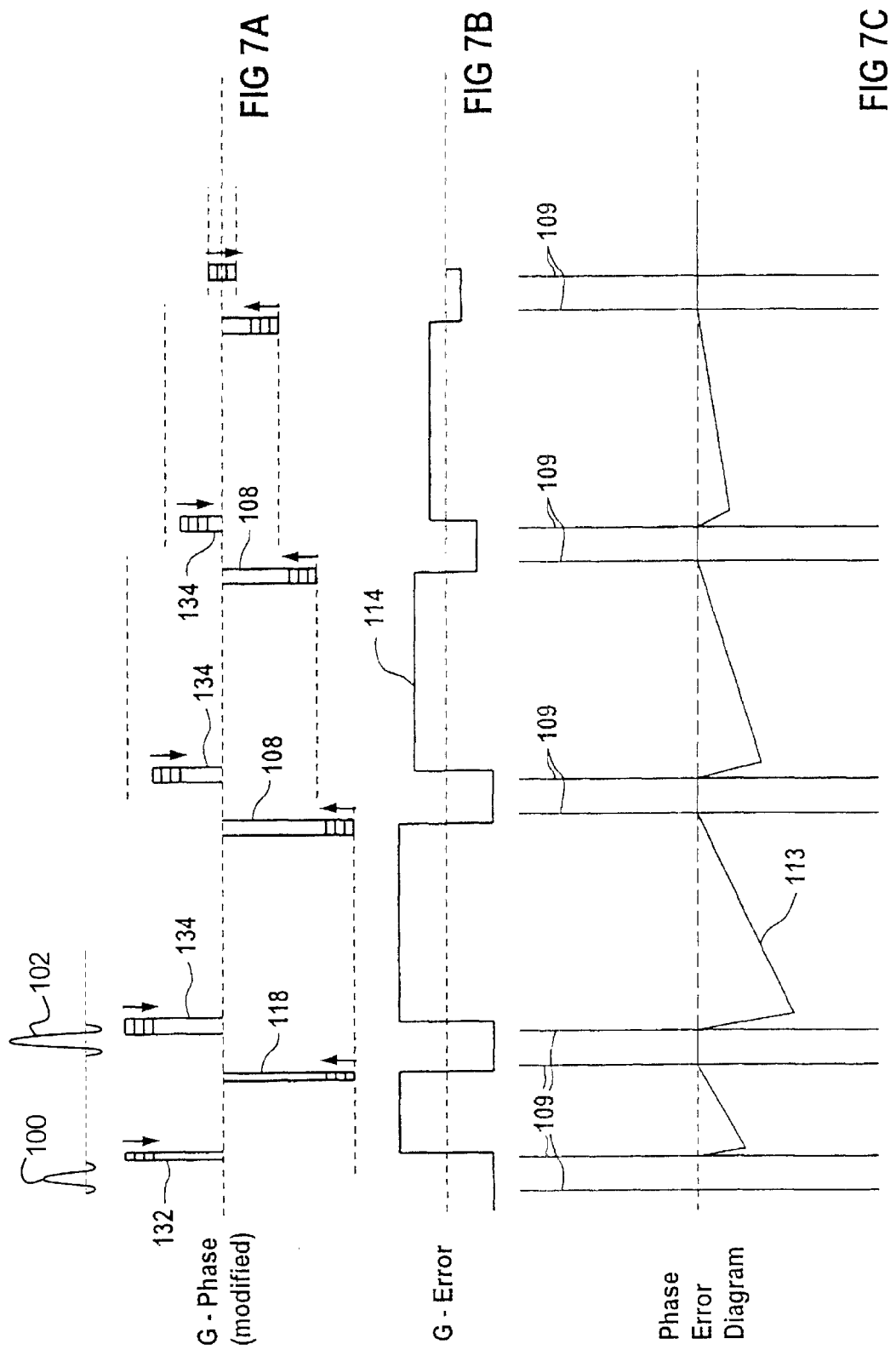

MULTI-ECHO MAGNETIC RESONANCE IMAGING METHOD WITH REDUCTION OF ARTIFACTS CAUSED BY REMANENCE MAGNETIZATION

BACKGROUND OF THE INVENTION

1. Field of the Invention

The invention is directed to a multi-echo magnetic resonance imaging of the type wherein a number of high-frequency pulses are generated including a high-frequency excitation pulse and a number of following high-frequency refocusing pulses, and wherein at least two phase encoding gradient pulses are respectively generated between the high-frequency refocusing pulses.

2. Description of the Prior Art

Imaging technologies on the basis of magnetic resonance signals (MR signals) are used in the medical field for preparing image datasets of a target area. For this purpose, the area to be examined is positioned in a strong homogeneous magnetic field of a diagnostic magnetic resonance apparatus (MR apparatus). A high-frequency excitation pulse, whose frequency is determined by the Larmor frequency, excites the magnetic resonance signals. Subsequent to the excitation and subsequent to a refocusing measure such as a high-frequency refocusing pulse, a magnetic resonance signal is received whose intensity is proportional to the density of the excited particles. In multi-echo imaging methods, further magnetic resonance signals are received by repeated refocusing measures after a one-time excitation. The location encoding of the magnetic resonance signals occurs by means of additional magnetic gradient fields modifying the frequency and the phase of the magnetic resonance signals in a location-dependent manner.

Multi-echo imaging methods, however, are highly sensitive to non-linearities in magnetic resonance apparatuses. The resulting strict requirements with respect to the device technology also relate to the "field purity" of the gradient system which always produces undesired time-dynamic noise fields in addition to the desired useful field. These time-dynamic noise fields cause phase errors in the MR signal with different effects on the image quality. The phase errors lead to interferences, so that the signals are no longer constructively superimposed, but destructively. For example, this results in a position-dependent signal cancellation in the images. Furthermore, so-called ghost images can occur which are caused by the different nature of the interferences of the different echo signals contributing to an image dataset.

A number of causes can be responsible for the origination of the aforementioned time-dynamic noise fields, such as eddy currents of all types and hysteresis effects and residual magnetizations associated therewith.

U.S. Pat. No. 5,729,139 discloses a multi-echo imaging method of the aforementioned type. The method disclosed therein prevents eddy currents and residual magnetizations from impairing the image quality. For this purpose, a modified reset gradient is generated in the phase encoding direction after the magnetic resonance signal has been received. The reset gradient consists of a component and of opposite polarity with a substantially equal gradient-time integrals, and a preceding phase encoding gradient and of a correction component for correcting the influence of eddy currents or residual magnetization caused by the preceding phase encoding gradient. It is disadvantageous hereby that the disturbing component must be known. The additional information about the disturbance variable is measured prior to the beginning of the image generation. The time required for this purpose is lost for the actual determination of the image data.

U.S. Pat. No. 6,043,656 describes a MR imaging system having a gradient compensation system which also compensates residual magnetizations. The gradient compensation system adds reset gradient pulses to the imaging gradient pulses, so that the residual magnetization is kept at a constant value. The reset gradient pulse either is generated after each imaging gradient or is generated only when the imaging gradient pulse has a polarity that is different from the selected residual magnetization. Image artifacts are thus reduced. This method, however, represents a limitation regarding the development of pulse sequences, since a corresponding period of time must be provided for the additional pulses.

In the MR imaging method described in European Patent 0 752 596 additional gradient pulses are added to the gradient pulses required for the imaging in order to return the residual magnetization to zero. Multi-echo sequences, however, are not described therein.

SUMMARY OF THE INVENTION

An object of the invention is to provide a multi-echo imaging method by which artifacts as a result of residual magnetizations are reduced without extending the measuring time.

This object is achieved in a multi-echo MR imaging method wherein at least two compensation phase encoding gradient pulses are generated between the high-frequency exciting pulse and the first high-frequency refocusing pulse, to counteract the influence of the residual magnetization as a noise field on the echo paths, so that signal deletions as a result of destructive interferences no longer occur at least in the echo paths of high signal intensity. The properties of the sequence do not worsen, for example with regard to the repetition time, echo time, number of slices etc., when gradient pulses are added between the high-frequency exciting pulse and the first high-frequency refocusing pulse. It is not necessary to know the disturbance variable for calculating the compensation phase encoding gradient pulses; the variable of the disturbance, therefore, must not be determined prior to the actual measuring.

The amplitudes of the compensation phase encoding gradient pulses can be simply determined when they correspond to the amplitude of the following phase encoding gradient pulse.

In another embodiment of the invention the chronological distance of the compensation phase encoding gradient pulses from one another is half of the chronological distance of the following two phase encoding gradient pulses from one another. Thus the phase error generated between the high-frequency excitation pulse and the first high-frequency refocusing pulse is half as large as the maximum phase error. The maximum phase error occurs between the first high-frequency refocusing pulse and the second high-frequency refocusing pulse.

As is subsequently explained in greater detail, the differences regarding the phase errors of the echo paths, which are crucial for the image quality, are adjusted to a minimum, so that the disturbing signal interferences are significantly reduced. Regardless of the remanence effects, there are similar influences on the image quality by the Maxwell terms (quadratic gradient terms). In order to also avoid disturbances resulting therefrom, the pulse duration of the compensation phase encoding gradient pulses, in a further embodiment, is half as long as the pulse duration of the two following phase encoding gradient pulses.

In another embodiment of the invention, the pulse durations of the phase encoding gradient pulses are varied between the individual high-frequency refocusing pulses, with the pulse amplitudes being essentially of the same magnitude. In particular, highly remanent noise fields are prevented. The pulse durations and the pulse amplitude are selected such that the time integrals of the gradient pulses are unmodified relative to the non-compensated original sequence.

In a further embodiment of the invention the phase encoding gradient pulses, between the high-frequency pulses, have a time integral value corresponding to the sign-inverted time integral value of noise fields between the corresponding high-frequency pulses. The variable of the noise fields must be known or determined in this specific embodiment; the compensation, however, can be almost ideally carried out.

DESCRIPTION OF THE DRAWINGS

FIGS. 1A to 1E show time-dependency diagrams of a turbo-spin echo sequence having seven echoes and monotonous k-space occupancy according to the prior art.

FIGS. 2A and 2B show a phase time-dependency diagram of ideal echo paths given the turbo-spin echo sequence of FIG. 1, wherein the echo paths provide a signal contribution to the fourth echo.

FIGS. 3A to 3C show a phase time-dependency diagram of the turbo-spin echo sequence of FIG. 1 disturbed by remanent residual fields, FIGS. 4A to 4C show time-dependency diagrams of a first exemplary embodiment of a modified turbo-spin echo sequence having additional compensation phase encoding gradient pulses between the high-frequency exciting pulse and the high-frequency refocusing pulse.

FIGS. 5A to 5C show a second exemplary embodiment of a modified turbo-spin echo sequence following the turbo-spin echo sequence of FIGS. 4A to 4C, wherein the amplitudes of the phase encoding gradient pulses are essentially the same.

FIGS. 6A to 6C show a third exemplary embodiment of a modified turbo-spin echo sequence following the turbo-spin echo sequence of FIGS. 4A to 4C, wherein phase encoding compensation pulses, between the phase encoding gradient pulses, are generated in an isochronously and sign-inverted fashion with respect to the noise field.

FIGS. 7A to 7C show a fourth exemplary embodiment of a modified turbo-spin echo sequence following the turbo-spin echo sequence of FIGS. 4A to 4C, wherein the time integral value of the phase encoding pulses between the high-frequency pulses corresponds to the time integral of the noise field.

DESCRIPTION OF THE PREFERRED EMBODIMENTS

FIGS. 1A to 1E show the basic structure of a turbo-spin echo sequence using a 7-echo sequence as an example, whereby the k-space occupancy (filling) occurs with monotonously ascending echo numbers. In the time diagram shown in FIG. 1A, a first high-frequency pulse 100, as a high-frequency excitation pulse, generates a cross magnetization in a target region which is repeatedly rephased by a number of following high-frequency refocusing pulses 102 (7 in this example) and therefore generates measurable magnetic resonance echo signals 104 whose time curve is shown in FIG. 1C. Individual phase encodings ensue such that the corresponding magnetic resonance echo signal 104 is allocated to a particular k-space segment (location). For this purpose, the phase encoding is adjusted with a first phase encoding gradient pulse 106 immediately after each high-frequency refocusing pulse 102; the phase encoding, after the magnetic resonance echo signal 104 has been received, is reset by a second phase encoding gradient pulse 108 that is of opposite polarity but of the same magnitude. Corresponding to the k-space occupancy, the phase is differently encoded after each high-frequency refocusing pulse 102. This process is repeated until the segments are completely filled with measuring data and entirely fill k-space. FIG. 1B shows the time curve of the corresponding slice selection gradient pulses 110, and FIG. 1D shows the time curve of the corresponding frequency encoding gradients 112.

In order to understand the image quality problems that are relevant here, it is necessary to view the central Fourier lines in the k-space. In the sequence example of FIG. 1A to FIG. 1E, the fourth echo is allocated to the central k-space segment. FIG. 2A and 2B is a section enlargement of the sequence of FIG. 1A to FIG. 1E from the excitation to this fourth echo and shows its exact signal origination with all signal components. The duration of the high-frequency pulses 100, 102 is limited by vertical lines 109.

Each high-frequency pulse 102 splits an existing magnetization into three paths which can be differentiated by the indices q=(−1, 0, +1). The indices respectively represent the following:

q=−1 transversal component with phase-inversion q=0 longitudinal component q=+1 transversal component without phase-inversion.

Therefore, $3^n$ magnetization paths exist after n high-frequency pulses 102 have been applied, designated as M($q_1 \ldots q_i \ldots q_n$) with $q_i=\{-1, 0, +1\}$ wherein $q_i$ represents the effect of the i-th high-frequency pulse 102 corresponding to the above definition. In these $3^n$ magnetization paths, however, only the ones that can be seen with a balanced dephasing/rephasing result at the echo time (transversal magnetization) contribute to the n-th echo, together with the influence of a static field and the pulsed readout gradients.

Therefore, the first echo 104 contains only one component, namely M(−1), and the second echo 104 contains two components, namely M(−1 −1) and M(0 −1). The third echo 104 already has 5 components, namely M(−1 −1 −1), M(−1 0 −1), M(0 −1 −1), M(0 0 −1) and M(+1 −1 +1). For the fourth echo 104, there are 13 paths, namely: M(−1 −1 −1 −1) M(0 −1 −1 −1) M(+1 −1 0 +1) M(−1 −1 0 −1) M(0 −1 0 −1) M(+1 −1 +1 −1) M(−1 0 −1 −1) M(0 0 −1 −1) M(+1 0 −1 +1) M(−1 0 0 −1) M(0 0 0 −1) M(−1 +1 −1 +1) M(0 +1 −1 +1)

The phase diagram in FIG. 2B shows the phase development of the individual echo paths 113 over time. The previously identified 13 echo paths 113 constructively interfere at the point in time 111 of the fourth echo 104. The signal intensity of the fourth echo 104 then corresponds to the sum of all individual contributions. Continuous lines show the transversal components and broken lines show the longitudinal components.

This ideal situation, however, requires a perfect MR apparatus. Real apparatuses, more or less, deviate from this ideal situation due to unavoidable time-dynamic noise fields.

Tests have shown that an error image arises, or can arise, due to undesired hysteresis effects at the gradient system. After a gradient pulse, the spatial magnetic field distribution, in the target area or imaging volume, does not return exactly to the original initial state but a remanent (residual) gradient remains. Given bipolar pulse sequences having alternating signs, the remaining residual gradient has the same sign and is essentially amplitude-proportional to the last pulse. Given single-polarity pulses of varying magnitude, the remanent residual gradient is essentially proportional to the largest pulse amplitude in this pulse series having the same sign.

For example, material properties of the pole shoes of the magnet system can be the cause for such behavior. This effect also can be caused by imprecision in the acquisition of the current actual value of the gradient currents. The described image interferences and remedial measures, however, are not limited to one of these specific causes but are generally true for undesired, remanent residual fields after gradient pulses.

As shown in FIGS. 1B and 1D, the pulses of the slice selection gradient 110 and of the readout gradient 112 (frequency encoding gradient) repeat after each high-frequency refocusing pulse 102 in the same way. Remanent residual fields subsequently produce a quasi-static field interference that influences the dephasing/rephasing result of the different echo paths in the same way, so that relative phase errors are not generated between the signal components. This is different for the phase encoding gradient having pulses 106 and 108, which encodes the individual echoes 104 in a different way. The remanent residual fields following the different phase encoding pulses 106 and 108 represent a time-dynamic interference which leads to phase differences, namely destructive interferences, between the echo paths 113 and therefore causes the position-dependent signal cancellations in the resulting images.

Similar to FIG. 2B, FIG. 3C shows a phase diagram with all signal components contributing to the fourth echo 104. The shown phase evolutions 113 result from the undesired remanent noise fields 114 whose time curve is shown in FIG. 3B. The noise fields are a result of the phase encoding gradient pulses 106 and 108 (shown in FIG. 3A). In order to simplify, effects such as those arising from the short negative noise fields during the high-frequency pulses 100 and 102 are not considered in this phase diagram, which is a reasonable simplification when the signal readout time is significantly longer than the high-frequency pulse duration.

The accumulated phase errors $\Psi(q_1, q_2, q_3, q_4)$ of the individual echo paths are linear combinations of the phase errors $\phi_{i,\,i+1}$ occurring between adjacent high-frequency pulses i and i+1 with the time $t_i$ and $t_{i+1}$. The following is valid when the exciting pulse 100 is generated at the time $t_0$, the first refocusing pulse 102 at the time $t_1$, etc.:

$$\varphi_{0,1} = \gamma \cdot r \cdot \int_{t_0}^{t_1} G_{Error} \cdot dt = -\frac{1}{2} \cdot \phi \quad \varphi_{1,2} = \gamma \cdot r \cdot \int_{t_1}^{t_2} G_{Error} \cdot dt = +\phi$$

$$\varphi_{2,3} = \gamma \cdot r \cdot \int_{t_2}^{t_3} G_{Error} \cdot dt = +\frac{2}{3} \cdot \phi \quad \varphi_{3,4} = \gamma \cdot r \cdot \int_{t_3}^{t_4} G_{Error} \cdot dt = +\frac{1}{3} \cdot \phi$$

wherein γ is the gyromagnetic ratio and r is the relevant local position in the direction of the remanent gradient. $\Phi = \phi_{1,2}$ is the maximum phase error arising between the first and second rephasing pulse 102 during the first echo 104 as a result of its maximum phase encoding. The accumulated phase errors $\Psi(q_1, q_2, q_3, q_4)$ of the individual echo paths are:

$$\Psi(-1-1-1-1) = (-1)^4 \varphi_{0,1} + (-1)^3 \varphi_{1,2} + (-1)^2 \varphi_{2,3} + (-1)^1 \varphi_{3,4}$$
$$= -(7/6)\Phi$$

$$\Psi(-1-1\ 0-1) = (-1)^3 \varphi_{0,1} + (-1)^2 \varphi_{1,2} + (-1)^1 \varphi_{2,3}$$
$$= +(5/6)\Phi$$

$$\Psi(-1\ 0-1-1) = (-1)^3 \varphi_{0,1} + (-1)^2 \varphi_{1,2} + (-1)^1 \varphi_{3,4}$$
$$= +(7/6)\Phi$$

$$\Psi(-1\ 0\ 0-1) = (-1)^2 \varphi_{0,1} + (-1)^1 \varphi_{1,2}$$
$$= -(9/6)\Phi$$

$$\Psi(-1+1-1+1) = (-1)^2 \varphi_{0,1} + (-1)^1 \varphi_{1,2} + (-1)^2 \varphi_{2,3} + (-1)^0 \varphi_{3,4}$$
$$= -(11/6)\Phi$$

$$\Psi(0\ -1-1-1) = (-1)^3 \varphi_{0,1} + (-1)^2 \varphi_{2,3} + (-1)^1 \varphi_{3,4}$$
$$= +(5/6)\Phi$$

$$\Psi(0\ -1\ 0\ -1) = (-1)^2 \varphi_{0,1} + (-1)^1 \varphi_{2,3}$$
$$= -(7/6)\Phi$$

$$\Psi(0\ 0\ -1-1) = (-1)^2 \varphi_{0,1} + (-1)^1 \varphi_{3,4}$$
$$= -(5/6)\Phi$$

$$\Psi(0\ 0\ 0\ -1) = (-1)^2 \varphi_{0,1}$$
$$= +(3/6)\Phi$$

$$\Psi(0+1-1+1) = (-1)^1 \varphi_{0,1} + (-1)^1 \varphi_{2,3} + (-1)^0 \varphi_{3,4}$$
$$= +(1/6)\Phi$$

$$\Psi(+1-1\ 0\ +1) = (-1)^1 \varphi_{0,1} + (-1)^1 \varphi_{1,2} + (-1)^0 \varphi_{2,3}$$
$$= +(1/6)\Phi$$

$$\Psi(+1-1+1-1) = (-1)^2 \varphi_{0,1} + (-1)^2 \varphi_{1,2} + (-1)^1 \varphi_{2,3} + (-1)^1 \varphi_{3,4}$$
$$= -(3/6)\Phi$$

$$\Psi(+1\ 0\ -1+1) = (-1)^1 \varphi_{0,1} + (-1)^1 \varphi_{1,2} + (-1)^0 \varphi_{3,4}$$
$$= -(1/6)\Phi$$

The accumulated phase errors of these 13 echo paths assume ten different, equidistant values, three of which are doubly occupied. The greatest phase difference is 3 Φ.

A numerical example will explain this in greater detail. For example, the maximum amplitude of the phase encoding pulses is 8.7 mT/m given a matrix size of 512×512 and a field of view (FOV) of 360 mm. Then, the size of the remanent residual gradient is 0.05%×8.7 mT/m=mT/m=4.35 μT/m. The phase error Φ arises by the affect during the echo readout time of 23.04 ms. Given the position r=100 mm, the following applies:

$$\phi = \gamma \cdot r \cdot \int_{t_1}^{t_2} G_{Error} \cdot dt =$$

$$360° \cdot 42.58 \frac{Hz}{\mu T} \cdot 100\ mm \cdot 4.35 \frac{\mu T}{m} \cdot 23.04\ ms = 154°$$

and the greatest phase difference 3 Φ is more than 450°. Therefore, strip-like signal cancellations already occur for distances less than 100 mm from the image center.

After the origination of these image interferences has been understood and can be quantitatively reconstructed, different sequence modifications are subsequently presented which significantly reduce the harmful effects on the image quality or completely eliminate them. All versions have this goal in common, expressed as $$\varphi_{0,1} = \frac{1}{2} \cdot \varphi_{1,2} = \frac{1}{2} \cdot \varphi_{2,3} = \frac{1}{2} \cdot \varphi_{3,4}$$

If the above equality is established, the accumulated phases $\Psi(q_1, q_2, q_3, q_4)$ are almost or completely identical for all echo paths and the disturbing interferences no longer occur at least in the image area. This is achieved by adding additional pulses given the phase encoding gradient. The sum effect of the noise fields thus leads to less splitting of the echo paths which are characterized by the indices $(q_1, q_2, q_3, q_4)$. The influences of the remanent noise fields are further reduced by suitably modifying the already present pulses.

FIGS. 4A to 4C explain a first sequence example with compensation of the influences of the remanent noise fields. As shown in FIG. 4A, two additional compensation phase encoding gradient pulses 116 and 118 are inserted between the high-frequency exciting pulse 100 and the first high-frequency refocusing pulse 102. Their amplitudes are selected to be equal to the two following phase encoding gradient pulses 106 and 108 for encoding the first echo. Their chronological spacing 120 should be—as far as is allowed by the existing sequence design—half as long as the chronological spacing 122 of the following phase encoding gradient pulses 106 and 108 to one another. It is thus achieved that $\phi_{0,1} = \frac{1}{2}\phi_{1,2}$ is valid independently of the pulses preceding this sequence repetition. The pulse durations of these additional pulses 116, 118 are initially uncritical as long as the amplitude proportionality of the remanent noise fields to the phase encoding gradient fields is fulfilled.

Regardless of the described remanence effects, there are similar negative effects on the image quality due to the what are referred to as Maxwell terms (square gradient terms). In order to avoid the interferences resulting therefrom, the pulse durations 124 of the additional pulses 116, 118 are selected half as long as the pulse durations 126 of the following pulses 106, 108 for encoding the first echo 104.

Analogous to the treatment of the non-compensated original sequence of FIGS. 1A–1E and FIGS. 3A–3C, the following is now valid for the inter-pulse phases $\phi_{i, i+1}$:

$$\varphi_{0,1} = \gamma \cdot r \cdot \int_{t0}^{t1} G_{Error} \cdot dt = +\frac{1}{2} \cdot \phi \quad \varphi_{1,2} = \gamma \cdot r \cdot \int_{t1}^{t2} G_{Error} \cdot dt = +\phi$$

$$\varphi_{2,3} = \gamma \cdot r \cdot \int_{t2}^{t3} G_{Error} \cdot dt = +\frac{2}{3} \cdot \phi \quad \varphi_{3,4} = \gamma \cdot r \cdot \int_{t3}^{t4} G_{Error} \cdot dt = +\frac{1}{3} \cdot \phi$$

and for the accumulated overall phases $\Psi(q_1, q_2, q_3, q_4)$:

$$\Psi(-1 -1 -1 -1) = (-1)^4 \varphi_{0,1} + (-1)^3 \varphi_{1,2} + (-1)^2 \varphi_{2,3} + (-1)^1 \varphi_{3,4}$$
$$= -(1/6)\Phi$$
$$\Psi(-1 -1 \ 0 -1) = (-1)^3 \varphi_{0,1} + (-1)^2 \varphi_{1,2} + (-1)^1 \varphi_{2,3}$$
$$= -(1/6)\Phi$$
$$\Psi(-1 \ 0 -1 -1) = (-1)^3 \varphi_{0,1} + (-1)^2 \varphi_{1,2} + (-1)^1 \varphi_{3,4}$$
$$= +(1/6)\Phi$$
$$\Psi(-1 \ 0 \ 0 -1) = (-1)^2 \varphi_{0,1} + (-1)^1 \varphi_{1,2}$$
$$-(3/6)\Phi$$
$$\Psi(-1 +1 -1 +1) = (-1)^2 \varphi_{0,1} + (-1)^1 \varphi_{1,2} + (-1)^2 \varphi_{2,3} + (-1)^0 \varphi_{3,4}$$
$$= -(5/6)\Phi$$
$$\Psi(0 \ -1 -1 -1) = (-1)^3 \varphi_{0,1} + (-1)^2 \varphi_{2,3} + (-1)^1 \varphi_{3,4}$$
$$= -(1/6)\Phi$$
$$\Psi(0 \ -1 \ 0 \ -1) = (-1)^2 \varphi_{0,1} + (-1)^1 \varphi_{2,3}$$
$$= -(1/6)\Phi$$
$$\Psi(0 \ 0 \ -1 -1) = (-1)^2 \varphi_{0,1} + (-1)^1 \varphi_{3,4}$$
$$= +(1/6)\Phi$$
$$\Psi(0 \ 0 \ 0 \ -1) = (-1)^2 \varphi_{0,1}$$
$$= -(3/6)\Phi$$
$$\Psi(0 +1 -1 +1) = (-1)^1 \varphi_{0,1} + (-1)^1 \varphi_{2,3} + (-1)^0 \varphi_{3,4}$$
$$= -(5/6)\Phi$$
$$\Psi(+1 -1 \ 0 \ +1) = (-1)^1 \varphi_{0,1} + (-1)^1 \varphi_{1,2} + (-1)^0 \varphi_{2,3}$$
$$= -(5/6)\Phi$$
$$\Psi(+1 -1 +1 -1) = (-1)^2 \varphi_{0,1} + (-1)^2 \varphi_{1,2} + (-1)^1 \varphi_{2,3} + (-1)^1 \varphi_{3,4}$$
$$= +(3/6)\Phi$$
$$\Psi(+1 \ 0 \ -1 +1) = (-1)^1 \varphi_{0,1} + (-1)^1 \varphi_{1,2} + (-1)^0 \varphi_{3,4}$$
$$= -(7/6)\Phi$$

The accumulated phase errors of the 13 echo paths now assume only 6 different, equidistant values, whereby one value is occupied four times, another value is occupied three times and two further values are occupied twice. The greatest phase difference now only is 5/3 $\Phi$. FIG. 4C shows the time curve of this phase development.

In order to be able to completely assess the efficacy of this sequence modification, the signal intensities of the 13 echo paths must also be taken into consideration. These are dependent on the flip angles generated by the high-frequency pulses. Since slice-selective high-frequency pulses are concerned, a flip angle distribution having varying values results along the slice profile, whereby the flip angle distribution depends on the used high-frequency pulse shapes. The high-frequency pulse shaping typically ensues such that the desired values (excitation with 90°, rephasing with 180°) are achieved as efficiently as possible. As a result, the echo paths having indices $q_i = -1$ show a higher signal than those with $q_i = 0$. Paths with $q_i = +1$ have the lowest signal intensity.

Echo paths with a high signal, which must be considered first, have a typical phase difference of 2$\Phi$ given the non-compensated original sequence. As a result of the sequence modification shown in FIGS. 4A and 4C, this values shrinks to ⅓ $\Phi$, i.e., an improvement by the factor 6 is obtained.

In practice, the sum effect of the noise fields no longer leads to a splitting of the echo paths.

Proceeding from the first exemplary embodiment of the interference-compensated sequence of FIGS. 4A–4C, the different phase encodings of the echoes, in a second exemplary embodiment, are generated in that the pulse durations 124, 126 of the compensation phase encoding gradient pulses 116, 118 and of the phase encoding gradient pulses 106, 108 vary and in that the pulse amplitudes are only negligibly modified. This is shown in FIG. 5A. Broken lines 128 show the height of the amplitudes with respect to pulses constant pulse duration 124, 126, as used for the sequence of FIGS. 4A–4C. In the version of FIGS. 5A–5C, the high pulse amplitudes and therefore the high remanent noise fields are completely prevented. FIG. 5B shows the remanent noise fields occurring thereby. The pulse durations and pulse amplitudes are selected such that the pulse integrals remain unaltered vis-à-vis the non-compensated original sequence (see FIGS. 1A–1E and FIGS. 3A–3C).

Due to the extended phase encoding gradient pulses 106, 108, less time is available for the signal readout process, particularly with respect to the Fourier rows at the edge of the k-space. This can be prevented by scanning k-space in a circular manner. This is even advantageous for a rectangle scanning, since virtually no information is lost and the signal-to-noise ratio is increased at the same time.

Phase errors do not occur in the phase diagram of the sum effect of interference and compensation gradients shown in FIG. 5C.

Given the inter-pulse phases $\phi_{i,\ i+1}$, the ideal state is practically achieved as a result of the approximately constant and low amplitudes of all phase encoding gradient pulses and therefore of the noise fields:

$$\varphi_{0,1} = \frac{1}{2} \cdot \varphi_{1,2} = \frac{1}{2} \cdot \varphi_{2,3} = \frac{1}{2} \cdot \varphi_{3,4}$$

The accumulated phases $\Psi(q_1, q_2, q_3, q_4)$ are equal for all echo paths and the disturbing interferences do not occur.

In a further exemplary embodiment, an active compensation is additionally carried out, but knowledge of the size of the remanent noise fields is a necessary condition. Proceeding from the sequence example of FIGS. 4A–4C, further phase encoding compensation pulses 130, corresponding to FIG. 6A, are added to the phase encoding gradient, namely at the same time and sign-inverted with respect to the noise fields 114 (FIG. 6B shows the time curve). In contrast to the previously described sequence exemplary embodiments, such a compensation, however, requires the knowledge of the effect variable (the remanent noise field).

If the effect variable is not a universal system property but varies from apparatus to apparatus, this type of compensation requires a system calibration, wherein this individual effect variable is determined once and is stored for the subsequent use during the imaging.

The inter-pulse phases vanish as a result of the sum effect of interference and compensation gradients. Therefore, the accumulated phases $\Psi(q_1, q_2, q_3, q_4)$ also vanish for all echo paths and the disturbing interferences do not occur (see phase diagram in FIG. 6C).

In a modified version of the previously described sequence example of FIGS. 6A–6C, phase encoding compensation pulses 132 are also formed with other pulse durations and pulse amplitudes than the remanent noise fields such that their time-integral effects remains the same between the high-frequency pulses 100, 102. In particular, the compensation pulses 132 and correspondingly modified phase encoding gradient pulses 134, corresponding to the sequence version of FIGS. 7A–7C, can ensue at the same time as the first compensation phase encoding gradient pulse 116 and the respective first phase encoding gradient pulses 106 after each high-frequency pulse 100, 102. This is equal to a suitable amplitude reduction of these pulses 116 and 106. FIG. 7A shows the time curve of the phase encoding gradients. FIG. 7B shows the thus caused time curve of the remanent noise field. As in the previous exemplary embodiment, it is necessary to know the effect variable for such a compensation.

In the same way as the previous exemplary embodiment, the inter-pulse phases $\phi_{i,\ i+1}$ vanish as a result of the sum effect of interference and compensation gradients.

The accumulated phases $\Psi(q_1, q_2, q_3, q_4)$ also vanish therewith for all echo paths and the disturbing interferences do not occur (see FIG. 7C).

Although modifications and changes may be suggested by those skilled in the art, it is the intention of the inventor to embody within the patent warranted hereon all changes and modifications as reasonably and properly come within the scope of his contribution to the art.

I claim as my invention:

1. A multi-echo magnetic resonance imaging method comprising the steps of:

generating a plurality of high-frequency pulses including a high-frequency excitation pulse followed by a plurality of high-frequency refocusing pulses, said plurality of high-frequency refocusing pulses including a first high-frequency refocusing pulse;

generating at least two phase encoding gradient pulses respectively between successive high-frequency refocusing pulses; and reducing image artifacts caused by remanence magnetization by generating at least two compensation phase encoding gradient pulses between said high-frequency excitation pulse and said first high-frequency refocusing pulse.

2. A multi-echo magnetic resonance imaging method as claimed in claim 1 wherein the step of generating at least two compensation phase encoding gradient pulses comprises generating said at least two compensation phase encoding gradient pulses with respective amplitudes corresponding to an amplitude of the phase encoding gradient pulses which immediately follow said compensation phase encoding gradient pulses.

3. A multi-echo magnetic resonance imaging method as claimed in claim 1 wherein the step of generating at least two compensation phase encoding gradient pulses comprises generating said at least two compensation phase encoding gradient pulses with a chronological distance therebetween which is half of a chronological distance between two successive phase encoding gradient pulses that immediately follow said at least two compensation phase encoding gradient pulses.

4. A multi-echo magnetic resonance imaging method as claimed in claim 1 wherein the step of generating at least two compensation phase encoding gradient pulses comprises generating said at least two compensation phase encoding gradient pulses each with a pulse duration that is half of a pulse duration of two phase encoding gradient pulses that immediately follow said at least two compensation phase encoding gradient pulses.

5. A multi-echo magnetic resonance imaging method as claimed in claim 1 wherein the step of generating at least two phase encoding gradient pulses comprises generating said at least two phase encoding gradient pulses with respective pulse amplitudes that are varied between said successive high-frequency refocusing pulses.

6. A multi-echo magnetic resonance imaging method as claimed in claim 1 wherein the step of generating at least two phase encoding gradient pulses comprises generating said at least two phase encoding gradient pulses with respective pulse durations that are varied between said successive high-frequency refocusing pulses.

7. A multi-echo magnetic resonance imaging method as claimed in claim 6 wherein the step of generating at least two phase encoding gradient pulses comprises generating said at least two phase encoding gradient pulses with substantially equal amplitudes.

8. A multi-echo magnetic resonance imaging method as claimed in claim 1 wherein the step of generating at least two phase encoding gradient pulses comprises generating said at least two phase encoding gradient pulses with a time integral value corresponding to a sign-inverted time integral value of noise fields between said successive high-frequency pulses.

9. A multi-echo magnetic resonance imaging method as claimed in claim 1 comprising the additional step of generating further compensation phase encoding gradient pulses, in addition to said at least two compensation phase encoding gradient pulses, simultaneously with said at least two compensation phase encoding gradient pulses between said high-frequency excitation pulse and said first high-frequency refocusing pulse, said further compensation phase encoding gradient pulses being sign-inverted with respect to noise fields between said high-frequency excitation and said first high-frequency refocusing pulse.

10. A multi-echo magnetic resonance imaging method as claimed in claim 9 wherein said further compensation phase encoding gradient pulses include a further compensation phase encoding gradient pulse having a same time integral value as noise fields occurring between said at least two phase encoding gradient pulses and a compensation phase encoding gradient pulse having a sign-inverted time integral value compared to said time integral value of said noise fields occurring between said at least two phase encoding gradient pulses.

* * * * *